(12) United States Patent
Rathei

(10) Patent No.: US 7,524,683 B2
(45) Date of Patent: Apr. 28, 2009

(54) METHOD OF MONITORING A SEMICONDUCTOR MANUFACTURING TREND

(75) Inventor: Dieter Rathei, Bergmanngasse 44/6, Graz (AT) A-8010

(73) Assignee: Dieter Rathei, Graz (AT)

( * ) Notice: Subject to any disclaimer, the term of this patent is extended or adjusted under 35 U.S.C. 154(b) by 308 days.

(21) Appl. No.: 11/443,241

(22) Filed: May 30, 2006

(65) Prior Publication Data

US 2007/0020782 A1    Jan. 25, 2007

Related U.S. Application Data

(60) Provisional application No. 60/700,221, filed on Jul. 18, 2005.

(51) Int. Cl.
*H01L 21/66* (2006.01)

(52) U.S. Cl. ........................................................ 438/14

(58) Field of Classification Search ........................ None
See application file for complete search history.

(56) References Cited

U.S. PATENT DOCUMENTS

| | | | |
|---|---|---|---|
| 2,883,255 A | | 4/1959 | Anderson |
| 3,142,820 A | | 7/1964 | Daniels |
| 3,351,910 A | | 11/1967 | Miller et al. |
| 4,849,741 A | | 7/1989 | Thomas |
| 5,963,881 A | * | 10/1999 | Kahn et al. .................. 702/35 |
| 6,367,040 B1 | | 4/2002 | Ott et al. |
| 6,553,521 B1 | | 4/2003 | Rathei et al. |
| 6,687,561 B1 | * | 2/2004 | Pasadyn et al. ............. 700/110 |
| 6,717,431 B2 | | 4/2004 | Rathei et al. |
| 7,321,805 B2 | * | 1/2008 | Yamada et al. ............. 700/121 |

FOREIGN PATENT DOCUMENTS

JP    61115678    6/1986

(Continued)

OTHER PUBLICATIONS

Rathei, D., "B. Defect Induced Parametric Yield Loss," presented at the International Symposium on Semiconductor Manufacturing (ISSM) in Tokyo, Japan, Sep. 27-29, 2004.

Ross, R., et al., "Separating Random and Systematic Defects," Technology News, Yield Management, Semiconductor International, Mar. 1999, 1 page.

(Continued)

*Primary Examiner*—Charles D. Garber
*Assistant Examiner*—Andre' C Stevenson
(74) *Attorney, Agent, or Firm*—The Nath Law Group; Jerald L. Meyer; Stanley N. Protigal

(57) ABSTRACT

A method of monitoring trends in semiconductor processes is provided. Lot values are assigned to each of a set of wafer lots prior to performing semiconductor processes. After at least some of the semiconductor processes, at least some of the wafer lots are tested to generate a set of test data. A degree of scrambling is calculated for the set of wafer lots already tested using the test data: calculating a current scrambling value by subtracting the lot value of a current wafer lot from a maximum lot value of the lot values assigned for the set of wafer lots to yield the current scrambling value; storing the current scrambling value into a set of scrambling values; and determining a current adjusted maximum scrambling value by multiplying a selected multiplier value with a current maximum scrambling value of the set of scrambling values for a selected number of wafer lots.

20 Claims, 9 Drawing Sheets

FOREIGN PATENT DOCUMENTS

| | | |
|---|---|---|
| JP | 5172581 | 7/1993 |
| JP | 2003194863 | 7/2003 |
| WO | 03048792 | 3/2002 |

OTHER PUBLICATIONS

Ross, R., et al., "Yield Modeling," Handbook of Semiconductor Manufacturing Technology, Ch. 26, Marcel Dekker, Inc., New York, pp. 851-868, (2000).

* cited by examiner

METHOD OF MONITORING A SEMICONDUCTOR MANUFACTURING TREND

This application claims the benefit of U.S. Provisional Application No. 60/700,221, filed on Jul. 18, 2005, entitled METHODS FOR MONITORING, SCREENING, AND AGGREGATING INTEGRATED CIRCUIT TEST DATA FOR USE IN EVALUATING SEMICONDUCTOR MANUFACTURING PROCESSES, which application is hereby incorporated herein by reference.

TECHNICAL FIELD

The present invention generally relates to semiconductors. In one aspect it relates more particularly to the testing of semiconductors and monitoring trends in semiconductor manufacturing.

BACKGROUND

Semiconductor manufacturers produce integrated circuits (ICs) or microchips in wafers. FIG. 1a generally illustrates the process of manufacturing ICs from wafers 4. Polished, single crystal wafers 4 are organized into an ordered set 8 of wafer lots 12. The wafer lots 12 are numbered according to the sequence in which the wafers are processed 16. For example, lot 0001 is submitted to wafer processing 16 first, followed by the submission of lot 0002, followed by the submission of lot 0003, etc. The most recent wafer lot submitted to wafer processing 16 is the wafer lot 0012.

However, due to the complex nature inherent in wafer processing 16, the wafer lots 12 are not processed in the same order 8 as they were submitted to wafer processing 16. In "Introduction to Semiconductor Equipment," Y. Nishi, R. Doering [Ed.] "Handbook of Semiconductor Manufacturing Technology," New York, Basel: Marcel Dekker, 2000, p. 23ff., incorporated herein by reference, J. Hutcheson states that despite the simple linear process flow typical of most semiconductor manufacturing processes, the " . . . work-in-progress (WIP) moving through the plant will follow complex paths, crisscrossing back and forth in intricate patterns."

The complex WIP in wafer processing 16 causes a re-ordering of the wafer lots 12. As FIG. 1a shows, the ordered set 20 of the wafer lots 12 that enter wafer test 24 from wafer processing 16 has a different order than the ordered set 8 of the wafer lots 12 that entered wafer processing 16. Wafer lot 0002 will enter wafer test 24 first, followed by wafer lot 0004, etc., The most recent wafer lot submitted to wafer test is the wafer lot 0009.

Testing of ICs 24 is done using automated test equipment (ATE). These semiconductor testers produce a vast amount of data, as there are typically several dozens or hundreds of particular tests per IC, between hundreds and thousands of microchips on a silicon wafer, and typically several thousand wafers produced per month in an average production facility. Hence, a medium sized semiconductor manufacturer typically maintains a database for the Yield Management System (YMS) software. YMS databases are used for analyzing data, finding correlations, and improving manufacturing yield through subsequent engineering decisions. For each wafer lot 12 in the set 20, IC test data is collected and stored in the YMS database.

The re-ordering or scrambling of the wafer lots 12 poses a significant problem to the analyses of the IC test data collected from the wafer lots 12. Established statistical process control (SPC) methods can not be directly and efficiently applied to IC test data from scrambled wafer lots 20, as these methods require that the order of the measurement data reflects the order of the manufacturing process to be controlled.

In one example, an undesired manufacturing flaw in wafer processing 16 is steadily worsening. The undesired increasing parameter trend has not been detected by inline tests performed during wafer processing 16. An SPC test has been designed to detect the undesired parameter trend. The SPC test detects six test measurements or points in a row steadily increasing or steadily decreasing. The SPC test is applied to the stored IC test data in the YMS database, however the undesired steadily increasing trend is not found. FIGS. 1b and 1c show how the scrambled wafer lots 20 cause the undesired trend to remain undetected.

With combined reference to FIGS. 1a and 1b, the graph 28 (FIG. 1b) illustrates IC test data parameter measurements of the wafer lots 12 (FIG. 1a) plotted 32 (FIG. 1b) according to the ordered set 8 (FIG. 1a) in which the wafer lots 12 (FIG. 1a) were submitted to wafer processing 16 (FIG. 1a). The graph 28 (FIG. 1b) does not have more than 6 test measurements increasing in a row, therefore the undesired trend in wafer processing 16 remains undetected.

With combined reference now to FIGS. 1a and 1c, the graph 36 (FIG. 1b) illustrates parameter measurements of the wafer lots 12 (FIG. 1a) plotted 40 (FIG. 1b) according to the ordered set 20 (FIG. 1a) in which the wafer lots 12 (FIG. 1a) were tested. Again, in graph 36 (FIG. 1b) no more than six test parameter measurements are steadily increasing in a row, and the SPC test fails to detect the flaw in the manufacturing process 16. Applying SPC methods directly and efficiently is critical to maintaining a high yield, which is of utmost importance for the productivity and competitiveness of a semiconductor manufacturer. Hence monitoring IC test data of scrambled wafer lots would be highly desirable.

SUMMARY OF THE INVENTION

The problems and needs outlined above may be addressed by embodiments of the present invention. In accordance with one aspect of the present invention, a method of monitoring trends in semiconductor processes is provided. This method includes the following steps described in this paragraph. The order of the steps may vary, may be sequential, may overlap, may be in parallel, and combinations thereof, if not otherwise stated. Lot values are assigned to each of a set of wafer lots prior to performing semiconductor processes on the set of wafer lots. The lot values have an increasing sequential order corresponding to an order in which the set of wafer lots are started in a beginning of the semiconductor processes. After at least some of the semiconductor processes, at least some of the wafer lots are tested to generate a set of test data. A degree of scrambling is calculated for the set of wafer lots already tested using the test data. The calculating of the degree of scrambling includes the following steps: (i) after a current wafer lot of the set of wafer lots is tested, calculating a current scrambling value by subtracting the lot value of the current wafer lot from a maximum lot value of the lot values assigned for the set of wafer lots to yield the current scrambling value; (ii) storing the current scrambling value into a set of scrambling values for the set of wafer lots; and (iii) determining a current adjusted maximum scrambling value by multiplying a selected multiplier value with a current maximum scrambling value of the set of scrambling values for a selected number of wafer lots.

This paragraph describes some embodiments of the aspect of the present invention described in the immediately preceding paragraph. A current number of lots of the set of wafer lots that should be included into a current moving average for monitoring a trend of one or more test results of the test data may be determined by using the current adjusted maximum scrambling value as the current number of lots included into the current moving average. The selected number of wafer lots may be a number of wafer lots tested for a selected period of time prior to the testing of the current wafer lot. The testing uses one or more electrical tests. The current scrambling value may be compared to a threshold scrambling value, and if the current scrambling value is less than the threshold scrambling value, the current wafer lot may be classified as a high priority wafer lot. A notifying action may be performed if the current wafer lot is classified as a high priority wafer lot. The threshold scrambling value may be a moving average of the scrambling values. The method may further include applying high priority evaluation rules to the current wafer lot if the current wafer lot is classified as a high priority wafer lot. The assigning of the lot values may include converting an original lot value to a number, wherein the original lot value includes at least one alphabetic character and at least one numeric character.

In accordance with another aspect of the present invention, a method of monitoring trends in semiconductor processes is provided. This method includes the following steps described in this paragraph. The order of the steps may vary, may be sequential, may overlap, may be in parallel, and combinations thereof, if not otherwise stated. Lot values are assigned to each of a set of wafer lots prior to performing semiconductor processes on the set of wafer lots. The lot values have an increasing sequential order corresponding to an order in which the set of wafer lots are started in a beginning of the semiconductor processes. After at least some of the semiconductor processes, at least some of the wafer lots are tested using one or more electrical tests to generate a set of electrical test data. A degree of scrambling is calculated for determining a current number of lots of the set of wafer lots that should be included into a current moving average for monitoring a trend of one or more test results of the set of electrical test data. The calculating of the degree of scrambling includes: (i) after a current wafer lot of the set of wafer lots is tested using the one or more electrical tests, calculating a current scrambling value by subtracting the lot value of the current wafer lot from a maximum lot value of the lot values assigned for the set of wafer lots to yield the current scrambling value; (ii) storing the current scrambling value into a set of scrambling values for the set of wafer lots; and (iii) determining a current adjusted maximum scrambling value by multiplying a selected multiplier value with a current maximum scrambling value of the set of scrambling values for a selected number of wafer lots.

This paragraph describes some embodiments of the aspect of the present invention described in the immediately preceding paragraph. The current scrambling value may be compared to a threshold scrambling value, and if the current scrambling value is less than the threshold scrambling value, the current wafer lot may be classified as a high priority wafer lot. A notifying action may be performed if the current wafer lot is classified as a high priority wafer lot. High priority evaluation and/or monitoring rules (e.g., rather than regular evaluation and/or monitoring rules) may be applied to the current wafer lot if the current wafer lot is classified as a high priority wafer lot.

In accordance with yet another aspect of the present invention, a method of monitoring integrated circuit manufacturing is provided. This method includes the following steps described in this paragraph. The order of the steps may vary, may be sequential, may overlap, may be in parallel, and combinations thereof, if not otherwise stated. Wafer lots are manufactured, and the manufacturing includes: (i) assigning a first lot value to a first wafer lot, (ii) storing the first lot value in a first data set, (iii) assigning a second lot value to a second wafer lot, and (iv) storing the second lot value in the first data set, wherein the second lot value is greater than the first lot value by an incremental unit value, and wherein starting manufacturing of the second wafer lot occurs after starting manufacturing of the first wafer lot. A wafer electrical test is performed on the first wafer lot. A scrambling value is calculated for the first wafer lot. The scrambling value is stored in a second data set. The scrambling value is the first wafer lot value subtracted from a largest lot value in the first data set. A maximum scrambling value is calculated. The maximum scrambling value is a currently largest scrambling value in the second data set scaled by a predetermined scaling factor. A parameter value is obtained from the first wafer lot (e.g., by an electrical test). The parameter value is stored in a third data set. A parameter moving average value is calculated. The parameter moving average value is an average of a selected number of the parameter values from the third data set. The selected number of parameter values is the maximum scrambling value. The selected number of the parameter values is from the wafer lots most recently tested. The parameter moving average value is stored in a fourth data set. A statistical process control rule is applied to a set of parameter moving average values in the fourth data set.

This paragraph describes some embodiments of the aspect of the present invention described in the immediately preceding paragraph. A notifying action may be performed if one or more values in the fourth data set is non-conforming to the statistical process control rule. The assigning of the first lot value to the first wafer lot may include converting an initial first lot value of the first wafer lot to a modified first lot value, wherein the initial first lot value includes characters such as an alphabetic character, numeric character, and combinations thereof. The predetermined scaling factor may account for additional scrambling occurring during the manufacturing process. The predetermined parameter may be IDDQ, power, output voltage, output current, chip functionality, capacitance-voltage, and combinations thereof, for example. The average of the set of parameter values may be a moving average or an exponential weighted moving average, for example. The statistical process rule may be a Western Electric rule, a Shewhart rule, or combinations thereof, for example.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
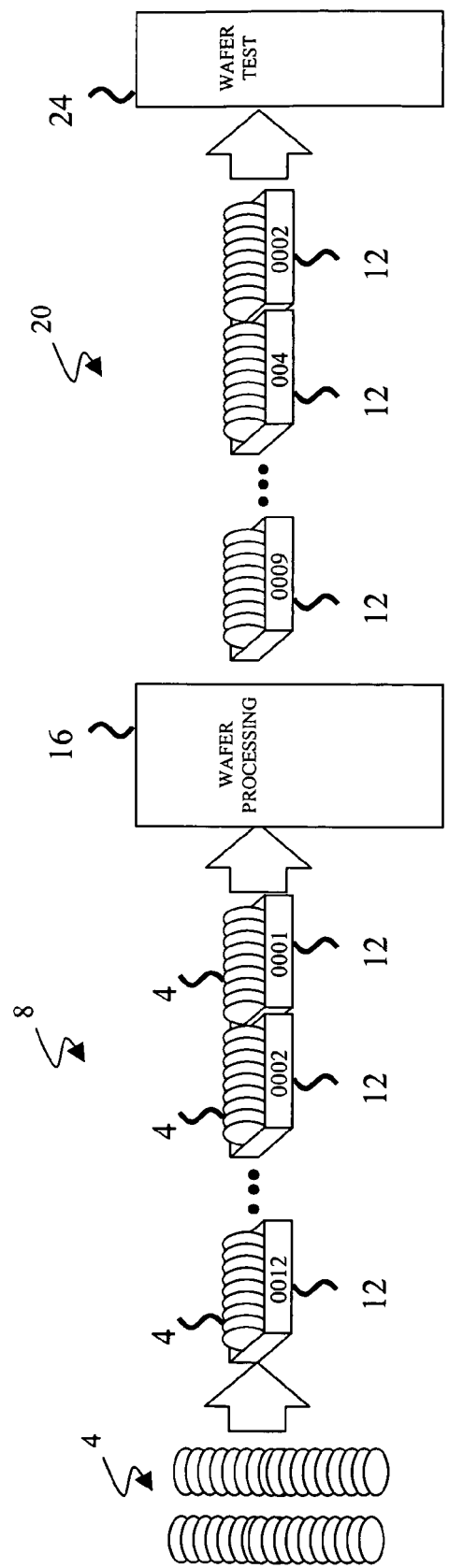
FIG. 1a is a generalized flow chart showing known steps in semiconductor manufacturing.
Figure 1B:
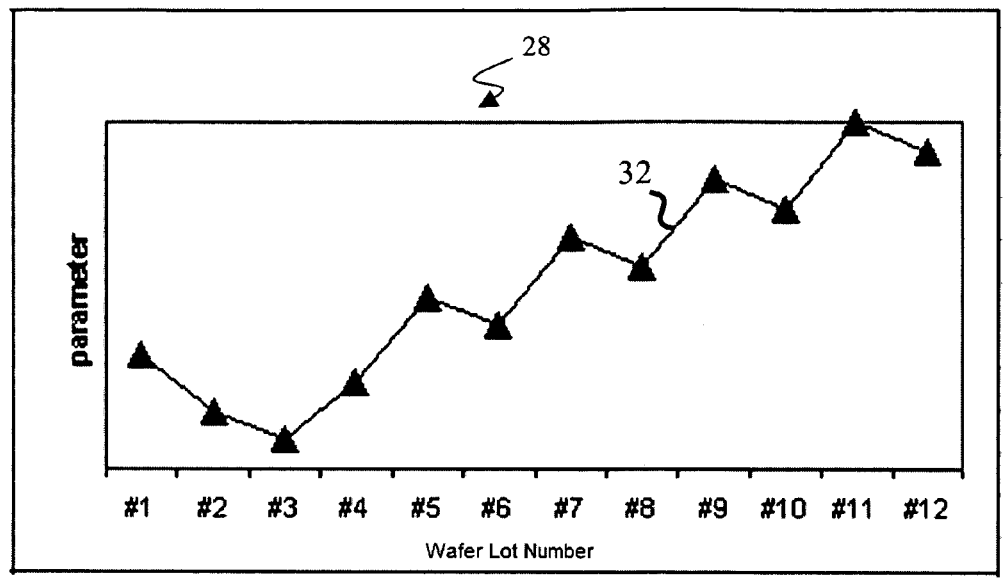
FIG. 1b is a graph showing measurements of a test parameter for wafer lots manufactured in a flawed wafer process.
Figure 1C:
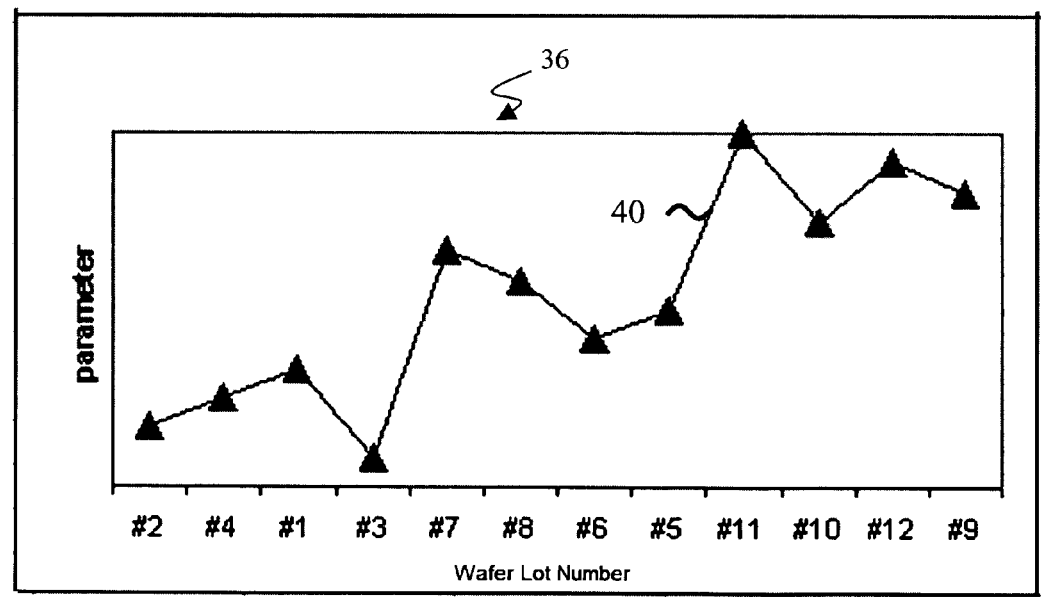
FIG. 1c is a graph showing measurements of a test parameter for wafer lots manufactured in a flawed wafer process.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 2:
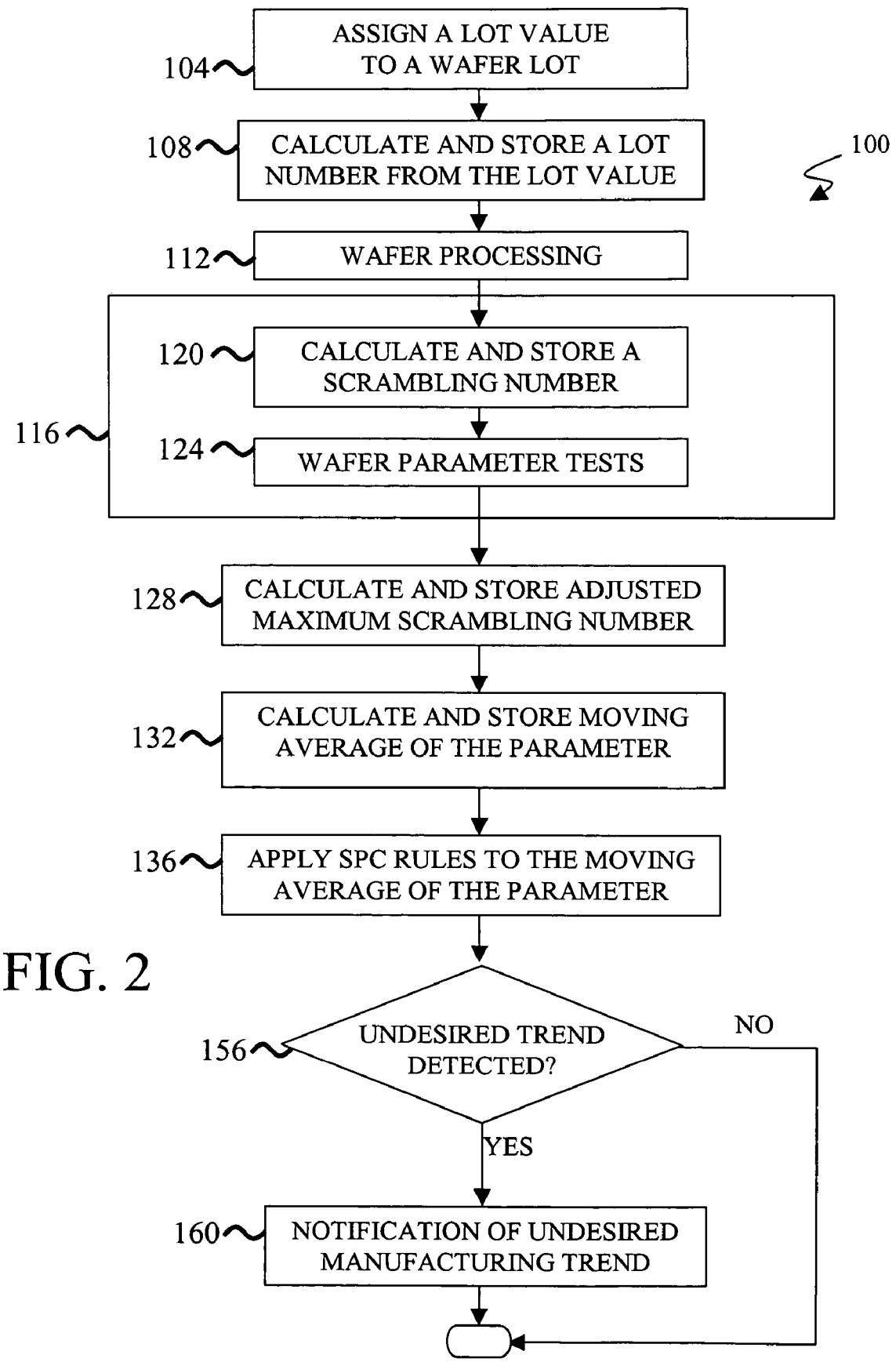
FIG. 2 is a flowchart showing a first illustrative embodiment of the present invention.

With reference now to FIG. 2, the method 100 of a first illustrative embodiment of the present invention is described. The first illustrative embodiment includes a set of wafer lots (not shown). Each wafer lot in the set of wafer lots comprises twelve wafers each, for example. The wafers in the set of wafer lots are, for example, silicon wafers and may or may not include any semiconductor devices yet.

With reference to FIG. 2, a wafer lot is selected from the group of wafer lots and a lot value is assigned (block 104) to the selected wafer lot. The lot value may be, for example, of type "X44795", following a given lot naming convention for one illustrative embodiment or of type "AEFB.XYZ", following a given lot naming convention for another given illustrative embodiment. The lot value AEFB.XYZ is an alphabetic value containing two strings of letters (e.g., AEFB and XYZ) separated by punctuation (e.g., a period). The string AEFB is the first string and the string XYZ is the second string. Wafer lot value assignment rules for the present embodiment limit the range of characters in the first string to the letters A through F. In other illustrative embodiments, the lot value may be any combination of numeric, alphabetic, or alpha-numeric characters and may include any number of symbols (e.g., comma, underscore, dash, exclamation mark, slash, and back-slash).

Continuing with FIG. 2, a lot value for the wafer lot is calculated. In some cases, as in the first illustrative embodiment, this may be reached by stripping all non-numeric characters, i.e. lot value "X44795" will result in the lot number 44795. In the second illustrative embodiment mentioned in the previous paragraph, the lot name consists of two parts separated by a dot, of which the first part needs to be interpreted as hexadecimal numbers and the second part needs to be stripped. In this case, the lot number again will be calculated as 44795, as this is the decimal equivalent of AEFB. Even if a combination of numeric, alpha-numeric and symbol characters are used as a lot name or lot value, a lot number can be calculated by using appropriate conversion algorithms, as is know to one of ordinary skill in the art. Thus, the wafer lot with the lot value "X44795" (in the one embodiment) and the wafer lot with the lot value AEFB.XYZ (in the second embodiment) may both henceforth be referred to with the numeric value 44795 (i.e., wafer lot 44795). The calculated lot number 44795 is stored in a lot value database (not shown).

Following the calculation and storage of a lot value for the wafer lot 44795 (block 108), integrated circuits are formed in the wafers of the wafer lot 44795 in the wafer processing step 112. Steps in the wafer processing step 112 may include scrub and dehydrate, deposition, photoresist application and removal, lithography, implantation, anneal, diffusion, and chemical mechanical polish (CMP), for example.

While the wafer lot 44795 is in wafer processing (block 112), other wafer lots are assigned a lot value (block 104), assigned a lot value (block 108), and submitted to wafer processing (block 112). The wafer lot values and the wafer lot numbers assigned to the wafer lots are in an incrementing order. For example, the next wafer lot submitted to wafer processing (block 112) after wafer lot 44795 has been assigned the wafer lot value AEFC.XYZ (block 104). The lot number of the wafer lot AEFC.XYZ has been calculated to be 44796 (block 108) and the lot value 44796 is stored in the lot value database. The next wafer lot submitted to wafer processing (block 112) after wafer lot 44796 has been assigned the wafer lot value AEFD.XYZ (block 104). The lot number of the wafer lot AEFD.XYZ has been calculated to be 44797 (block 108) and the lot value 44797 is stored in the lot value database.

The lot value 44796 is one incremental unit larger than the lot value of the wafer lot 44795. The incremental unit of the first embodiment is one, however the incremental unit in other embodiments may be any number, including 1, 2, 3, 5, 10, and 100, for example. In an illustrative embodiment in which the incremental unit is 10, first, second, and third wafer lots successively starting wafer processing may have lot values of 20010, 20020, and 20030 respectively, for example.

The combined steps of the assignment of a wafer lot value (block 104), the calculation and storage of a lot value (block 108), and the starting of a wafer lot in wafer processing (block 112) may take seconds or minutes to perform. In contrast, the wafer processing step (block 112) may occupy lengths of time ranging from weeks to months. It is possible therefore, to start wafer lots in wafer processing (block 112) before previously started wafer lots have completed wafer processing. Thus, for a period of time the wafer lots 44795, 44796, and 44797 are all in wafer processing (block 112) at the same time. As a result of the complex nature inherent in wafer processing (block 112), wafer lot 44797 completes wafer processing before wafer lots 44795 and 44796.

As shown in FIG. 2, following wafer processing (block 112), wafer lot 44797 begins wafer testing (block 116). In the present embodiment, wafer testing (block 116) may be performed in the same building as wafer processing (block 112). However in other illustrative embodiments wafer processing (block 112) and the wafer testing (block 116) may be performed in geographical locations separated by any distance. For example, wafer processing (block 112) may be performed in the United States and wafer testing (block 116) may be performed in Taiwan. In addition, wafer testing (block 116) may occur in different geographical regions for wafer lots from a single wafer processing location. For example, in yet another illustrative embodiment, wafer processing (block 112) is performed on wafer lots 10002 and 10003 in the United States, but wafer testing (block 116) is performed on lot 10002 in Germany, and wafer testing (block 116) is performed on wafer lot 10003 in South Korea.

With continuing reference to FIG. 2, the first step in wafer testing (block 116) is the calculation and storage of a scrambling number for the wafer lot 44797 (block 120). The scrambling number is calculated by subtracting the lot value 44797 from the largest lot value in the lot value database. The lot value database includes the lot values of all wafer lots that have begun the wafer processing step 112. In this example, the lot value database includes the lot values 44795, 44796, 44797, and increasingly larger lot values corresponding to wafer lots that began, wafer processing (block 112) before wafer lot 44797 began wafer testing (block 116). In this illustrative embodiment, the largest lot value in the database at the time the wafer lot 44797 begins wafer testing (block 116) is 44900. The subtraction of the lot value 44797 from 44900 results in the scrambling number 103 for the wafer lot 44797. The scrambling number 103 of the wafer lot 44797 is stored in a scrambling number database (not shown).

With continuing reference to FIG. 2, following the calculation and storage of the scrambling number (from block 120), the wafer lot 44797 is placed in automatic test equipment (ATE) and wafer parameter tests 124 are performed on the wafer lot 44797. The automatic test equipment stores the measurement of multiple functional and parametric parameters, including the direct drain quiescent current ($I_{DDQ}$) parameter for the wafer lot 44797, for example. Other wafer test parameters measured for the wafer lot 44797 during wafer parameter testing (block 124) may include tests such as poly sheet resistance, rise time, fall time, delay, voltage levels, drive current, and power, for example. The wafer test parameter measurements for wafer lot 44797, including the $I_{DDQ}$, are preferably stored in a YMS database.

As shown in FIG. 2, following wafer testing (block 116) the maximum scrambling number is calculated and stored (block 128). The maximum scrambling number is the result of multiplying the largest scrambling number in the scrambling number database with a user-defined scaling number. The largest scrambling number in the scrambling number database for this example is 121.

The user-defined scaling number of the step 128 in FIG. 2 is read from a user database. The user-defined scaling number reflects the extent of wafer lot re-ordering in wafer processing (block 112) in comparison with other wafer processes. The wafer processing (block 112) is a complex wafer process in which the order of wafer lots leaving wafer processing (block 112) may be significantly different than the order in which the same wafer lots started wafer processing. The user defined scaling number for complex processes is preferably above 1.0, and thus, the user-defined scaling number of this example is 1.6. A relatively or comparably simpler wafer processing preferably may have a scaling number at or below 1.0. Although the user-defined scaling number may be changed at any time and any number of times, it is preferably stored once and read repeatedly for the calculation of the maximum scrambling number (block 128).

Although optional, the user-defined scaling number is preferred and may provide significant advantages in the present embodiment. The user-defined scaling number provides fine-tuning of the maximum scrambling number, and accounts for variations in the complexity of wafer processes. The scaling number therefore may provide greater accuracy in detecting undesired trends across multiple wafer processes, and may provide earlier detection of the undesired trends, thereby improving yield.

With reference still to step 128 in FIG. 2, the multiplication of the user-defined scaling number (e.g., 1.6) with the largest scrambling number in the scrambling number database (e.g., 121) results in a maximum scrambling number of 193.6 for the wafer lot 44797. The maximum scrambling number for the wafer 44797 is preferably rounded to the nearest integer (e.g., 194) before being stored in a maximum scrambling number database. However, in other illustrative embodiments the maximum scrambling number is always rounded down, always rounded up, or is not rounded, for example.

As shown in FIG. 2, the arithmetic average (a.k.a., moving average) of the wafer lot 44797 is calculated for the $I_{DDQ}$ parameter (block 132). The number of $I_{DDQ}$ measurement values used to calculate the average $I_{DDQ}$ value (block 132) is the maximum scrambling number 194 of the wafer 44797. Thus, to calculate the moving average of the $I_{DDQ}$ parameter for the wafer lot 44797, the $I_{DDQ}$ measurement of the wafer lot 44797 is summed with the previous 194 wafer lot $I_{DDQ}$ measurements and the sum is divided by 194. The moving average of a wafer lot in illustrative embodiments of the present invention may calculated using any algorithm, however the number of measurements included in the moving average calculation is preferably the maximum scrambling number of the same wafer lot. In another illustrative embodiment, the moving average is an exponentially weighted moving average (EWMA), for example.

Figure 3:
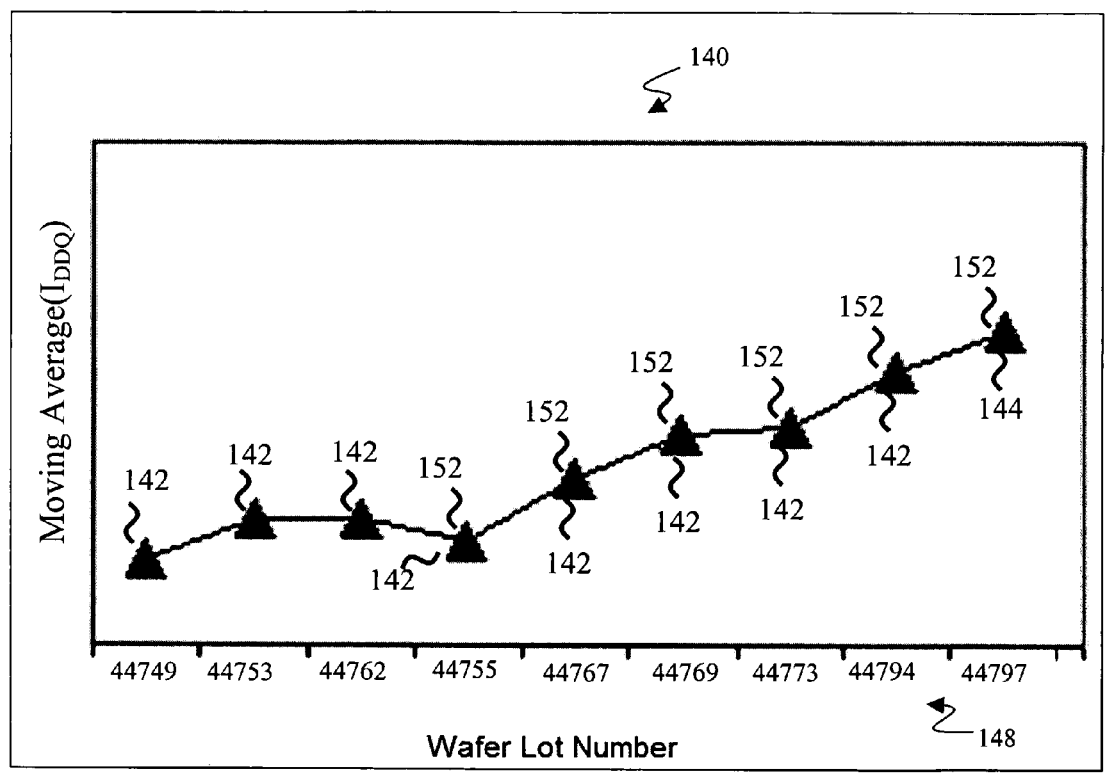
FIG. 3 is a graph illustrating the method of trend detection of the first illustrative embodiment.

As shown in step 136 of FIG. 2, statistical processing (SPC) rules are usually applied to the moving averages. FIG. 3 is a plot 140 of the moving averages 142 of the $I_{DDQ}$ parameter value for both the wafer lot 44797 (data point 144) and other wafer lots 148 tested prior to the testing of wafer lot 44797. The SPC rule applied to the moving averages detects any trend of six test parameter measurements (a.k.a., points) in a row steadily increasing or steadily decreasing. As shown in the plot 140, the moving average of the wafer lot 44797 is the sixth test parameter measurement of six steadily increasing points 152. Other SPC rules applied in the present illustrative embodiment include tests for special causes, such as Western Electric rules or Shewhart rules with tightened control limits for example.

Referring again to FIG. 2, the application of the SPC rule (block 136) leads to the decision block 156. Because an undesired upward trend has been detected (block 156), notification of the undesired manufacturing trend (block 160) is required. The notification (block 160) may be sent to several process control technicians and process engineers. The notification (block 160) may use multiple methods of communication, including an email alert, a text message to a cell phone, a page to a paging device, a pop-up window on a computer screen, and an alert message in a process control software application, for example.

In the first illustrative embodiment the maximum scrambling number database, the scrambling number database, the user database, and the lot value database are separate databases. In other illustrative embodiments the maximum scrambling number, the scrambling number, the user database, and the lot value may be stored in any number of databases and in any combinations, including a single stand-alone database or a database in the YMS database, for example. Furthermore, databases in the present illustrative embodiment may be distributed over a network or may be stored in a single storage device, for example.

Because the present illustrative embodiment applies SPC rules to the moving average rather than the raw data, it provides identification of potential yield-degrading threats earlier than known methods. Identifying threats early with high sensitivity can prevent costly yield degradation and improve manufacturing efficiency. Improving manufacturing efficiency may save millions of dollars for semiconductor manufacturers.

The first illustrative embodiment shown in FIGS. 2 and 3 described a method to more quickly detect a negative or undesired trend of a manufacturing process (a.k.a., wafer processing) in which the order of wafer lots is scrambled. The first illustrative embodiment provides the advantage of increasing yield.

Figure 4:
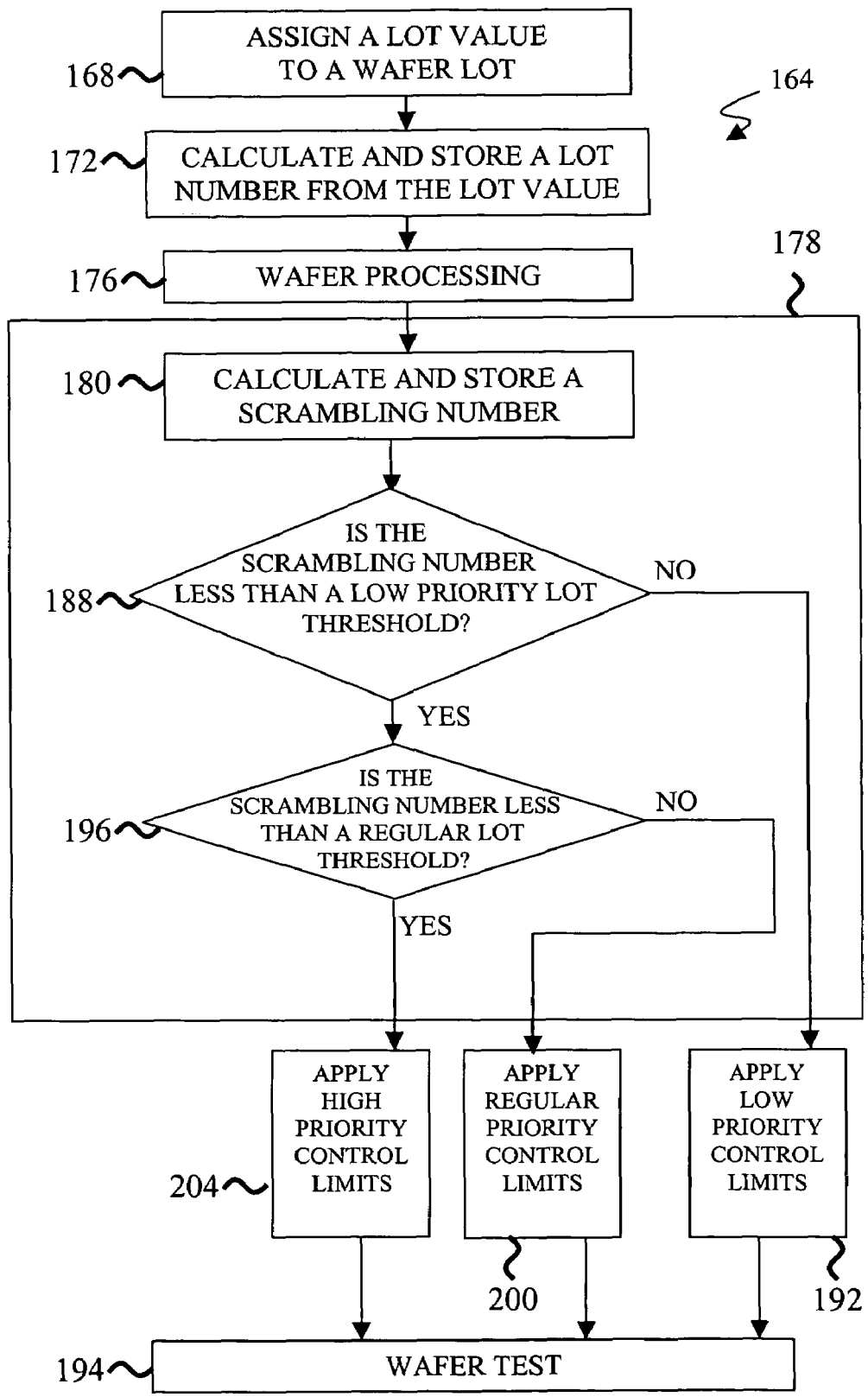
FIG. 4 is a flowchart in accordance with a second illustrative embodiment of the present invention.

A second illustrative embodiment shown in FIG. 4 also provides the advantage of increasing yield. The method 164 of the second illustrative embodiment of the present invention is shown in FIG. 4. An unprocessed wafer lot (not shown) is assigned a lot value of A10092.YZ (block 168). The lot value is preferably stored in a YMS database, for example. The lot value of the wafer lot A10092.YZ is calculated to be 10092 and is stored in the YMS database (block 172). The wafer lot 10092 is subsequently processed in wafer processing (block 176).

Upon completing wafer processing (block 176), the wafer lot 10092 enters wafer testing (block 178). In wafer testing (block 178), a scrambling number for wafer lot 10092 is calculated to be 2 in this example. The scrambling number for wafer lot 10092 is then stored 180 into a scrambling number database (block 180).

As shown in FIG. 4, the scrambling number is then compared with the low priority lot threshold (block 188). The low priority lot threshold is 15 in this example. The low priority threshold is a number that has been determined by controllers of the wafer processing (block 176) to designate wafer lots that have been in wafer processing (block 176) for a longer period of time than most wafers. Wafer lots in the second embodiment that have scrambling numbers above the low priority lot threshold are wafer lots that have been overly delayed in wafer processing (block 176), and are thus considered low priority. Broader control limits are placed on the test measurements of low priority wafer lots (block 192) during wafer testing (block 194).

The scrambling number 2 of the wafer lot 10092 is then compared with the regular priority lot threshold (block 196). The regular priority lot threshold is 4 is this example. The regular priority threshold is a number that has been determined by controllers of the wafer processing (block 176) to designate wafer lots that have been in wafer processing (block 176) for an average period. Wafer lots in the second illustrative embodiment that have scrambling numbers above the regular priority lot threshold are wafer lots that have been given a medium priority in wafer processing (block 176). Regular control limits are placed on the test measurements of regular priority wafer lots (block 200) during wafer testing (block 194). The regular priority threshold may be determined by calculating a moving average of the scrambling values of a selected number of wafer lots, for a set of wafer lots, for a selected period of time, or any combination thereof, for example. In another embodiment or application, the low priority threshold may be determined by calculating a moving average of the scrambling values, or some selected factor thereof.

Because the scrambling number 2 of the wafer lot 10092 is below the regular lot threshold of 4 and below the low priority threshold of 15, the wafer lot 10092 is considered a "hot lot" or a high priority lot. Hot wafer lots are given priority over regular wafer lots and low priority wafer lots and are typically expedited through wafer processing (block 176). Because the wafer lot 10092 has been identified as a hot lot, high priority control limits are applied to the test measurements of the wafer lot 10092 (block 204) during wafer testing (block 194).

High priority control limits are preferably tighter control limits and allow a smaller statistical deviation in test measurements than regular wafer lots and low priority wafer lots.

A significant advantage may be provided by the priority classification of the wafer lot 10092 in the method 164 of the second illustrative embodiment. Known methods typically apply a single set of statistical controls to all wafer lots. In contrast, the second embodiment includes a method of tailoring statistical process control limits according to the priority level of wafer lots. The second embodiment also provides a way to identify hot lots and classify lots according to their pace in the wafer processing (block 176).

The method 164 in the second embodiment prevents the unnecessary disqualification of low priority wafer lots. The low priority control limits applied to a low priority wafer lot may allow a low priority wafer lot to pass wafer lot test 194 due to the greater statistical deviation allowed for low priority wafer lots. In contrast, a known test method might apply a single set of statistical limits based on the estimated statistical deviation allowed for a regular lot. Thus, in a known test method a low priority lot that has parameter values within the low priority control limits but outside the regular priority control limits may cause the manufacturing line to be unnecessarily subjected to additional investigation regarding the apparently abnormal (but in fact normal) parameter values. Thus, the costly time wasted investigating a false error in the known method is salvaged in the second embodiment.

The method 164 provides more accurate testing of high quality, high priority wafer lots that have passed through wafer processing 176. The high priority control limits applied to a high priority wafer lot in the second embodiment may detect undesired test measurements in a high priority wafer lot due to the smaller statistical deviation allowed for high priority wafer lots. A known test method might apply a single set of statistical limits based on the estimated statistical deviation allowed for a regular lot. However, the statistical deviation required for a high priority lot is typically more narrow than the statistical deviation allowed for a regular lot. Thus, a high priority wafer lot in the known method with test measurements below the high priority lot statistical limits would not be discarded because the measurements were greater than the single set of regular priority statistical limits.

Tighter control limits are applied to the high priority lots because the high priority lots are an important information carrier regarding the state of the manufacturing line. The high priority lots are an important information carrier because they have been processed more recently in the manufacturing line.

In another illustrative embodiment of the present invention, a wafer lot with a degree of scrambling of two is compared to a scrambling threshold value of three. Since the degree of threshold is less than the scrambling threshold, the wafer lot of the present embodiment is classified in the yield management system database as a hot lot. A process engineer evaluating the test parameter measurements of the wafer lot has been notified through the yield management system database of the classification of the wafer lot as a hot lot.

After wafer testing, the test parameter measurements of the wafer lot in the present embodiment are compared to test parameter specification ranges. The statistical deviations of the test measurements of the hot lot are tighter than the statistical deviation of the wafer lots processed in due course (a.k.a., regular lots). For example, the statistical deviation allowed to test parameter measurements of the hot lot is +/−3% whereas the statistical deviation allowed to regular lots is +/−15%.

Figure 5:
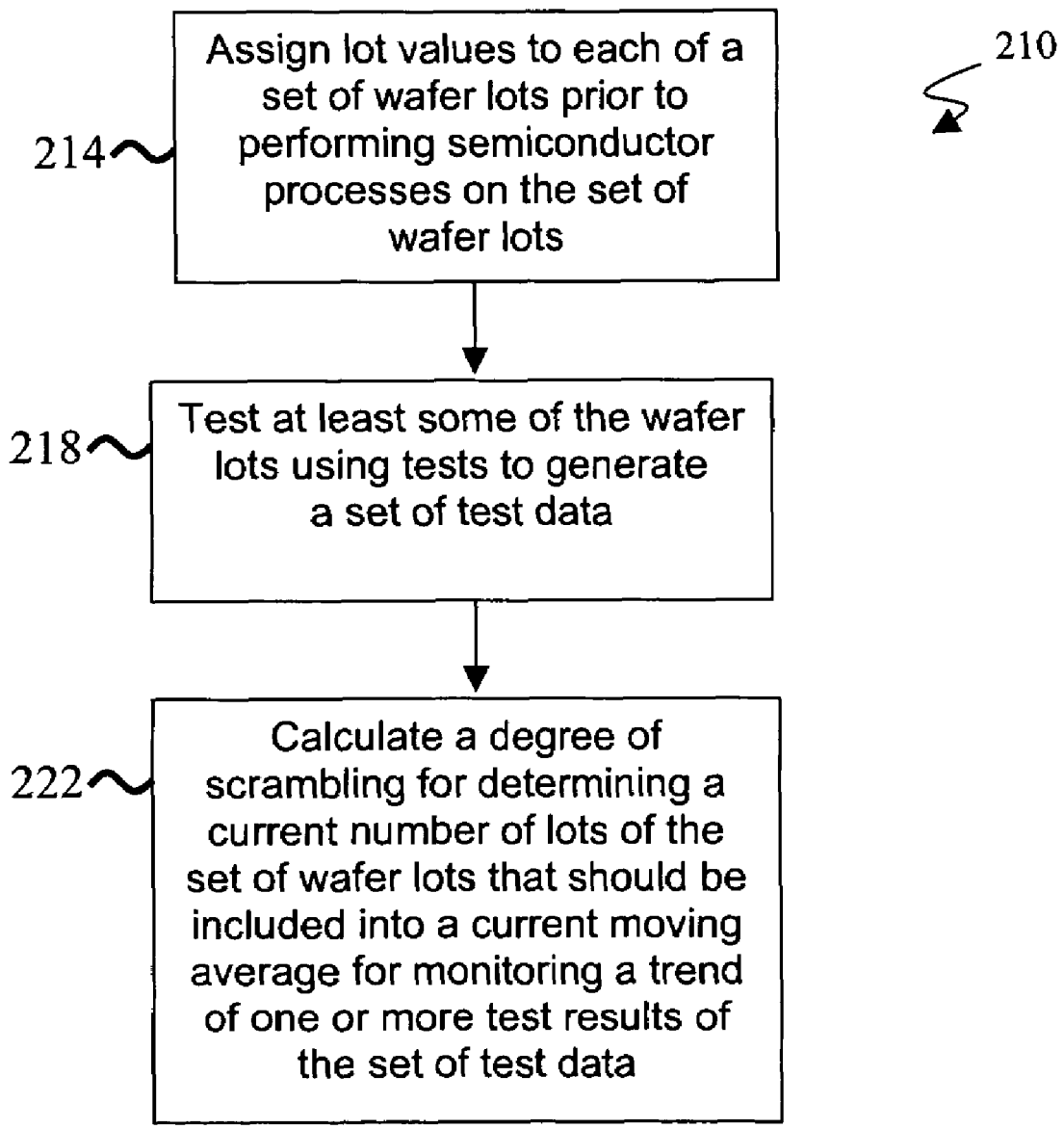
FIGS. 5 and 6 are flowcharts in accordance with a third illustrative embodiment of the present invention.
Figure 6:
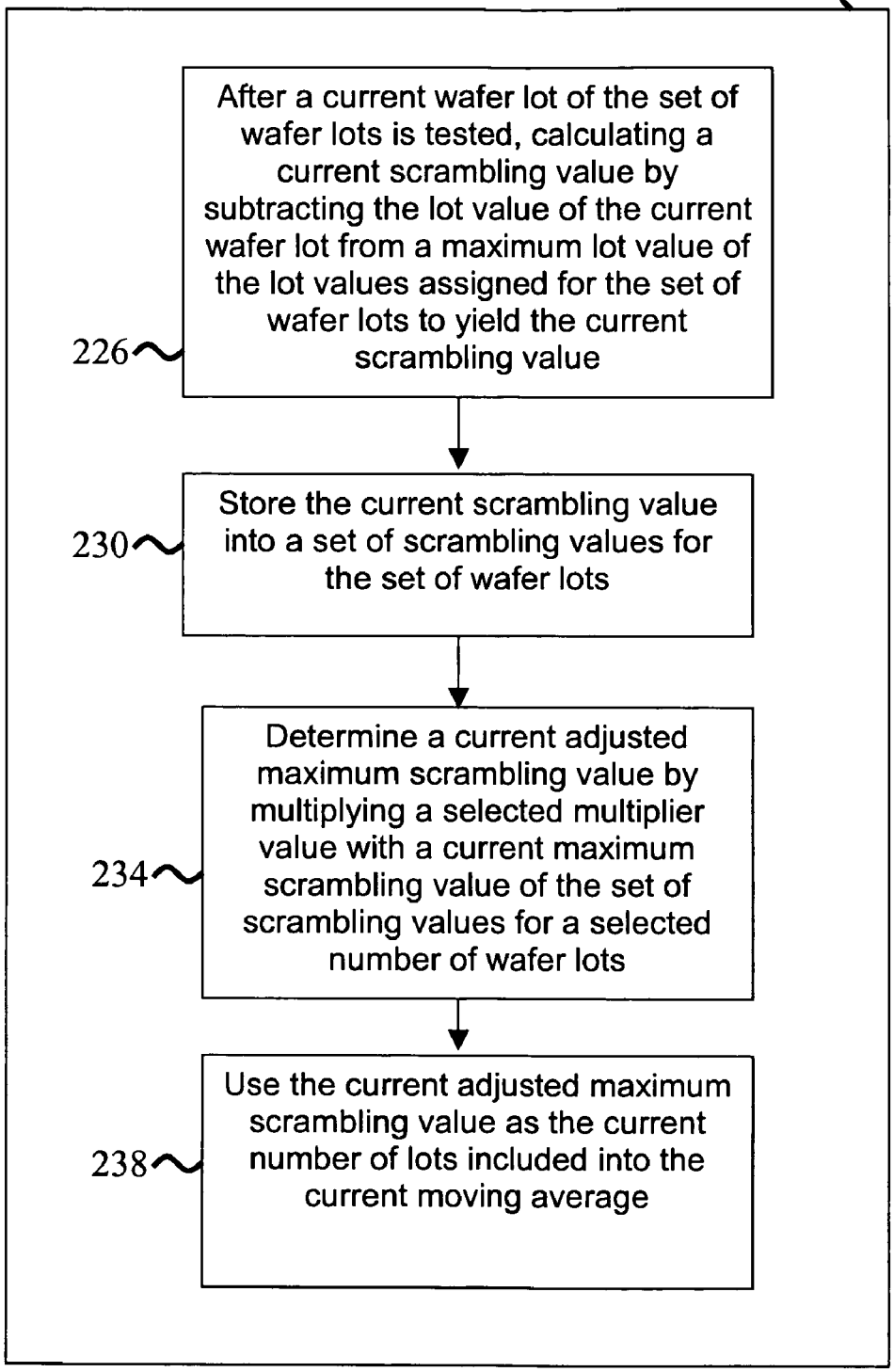

FIGS. 5-8 show flowcharts that more generally describe functions common in many of the embodiments of the present invention. FIGS. 5 and 6 show a method embodiment of monitoring trends in semiconductor processes, in accordance with the present invention. FIG. 6 illustrates sub-steps of one of the steps in FIG. 5.

With reference now to FIG. 5, steps in the method of a third embodiment 210 of the present invention are shown. Lot values are assigned to each of a set of wafer lots prior to performing semiconductor processes on the set of wafer lots (block 214). The lot values typically have an increasing sequential order corresponding to an order in which the set of wafer lots are started in a beginning of the semiconductor processes. A beginning of the semiconductor processes may be a wafer scrub and dehydrate step, for example.

Block 218 in FIG. 5 shows that after at least some of the semiconductor processes, at least some of the wafer lots are tested (e.g., using one or more electrical tests to generate a set of electrical test data). Next, a degree of scrambling is calculated for determining a current number of lots of the set of wafer lots that should be included into a current moving average for monitoring a trend of one or more test results of the set of electrical test data (block 222).

Calculating the degree of scrambling (block 222 in FIGS. 5 and 6) includes the steps shown in blocks 226, 230, 234, and 238 of FIG. 6, which are described in many of the embodiments above. In the first step shown in block 226, a current scrambling value is calculated after a current wafer lot of the set of wafer lots is tested. The current scrambling value is calculated by subtracting the lot value of the current wafer lot from a maximum lot value of the lot values assigned for the set of wafer lots to yield the current scrambling value. For the second step 230 in the calculating of the degree of scrambling (block 222), the current scrambling value is stored into a set of scrambling values for the set of wafer lots. Following the storage of the current scrambling value (block 230), a current adjusted maximum scrambling value is determined by multiplying a certain multiplier value with a current maximum scrambling value of the set of scrambling values for a certain period of time (block 234). In the fourth step 238 in the calculating of the degree of scrambling (block 222), the current adjusted maximum scrambling value is used as the current number of lots included into the current moving average.

Figure 7:
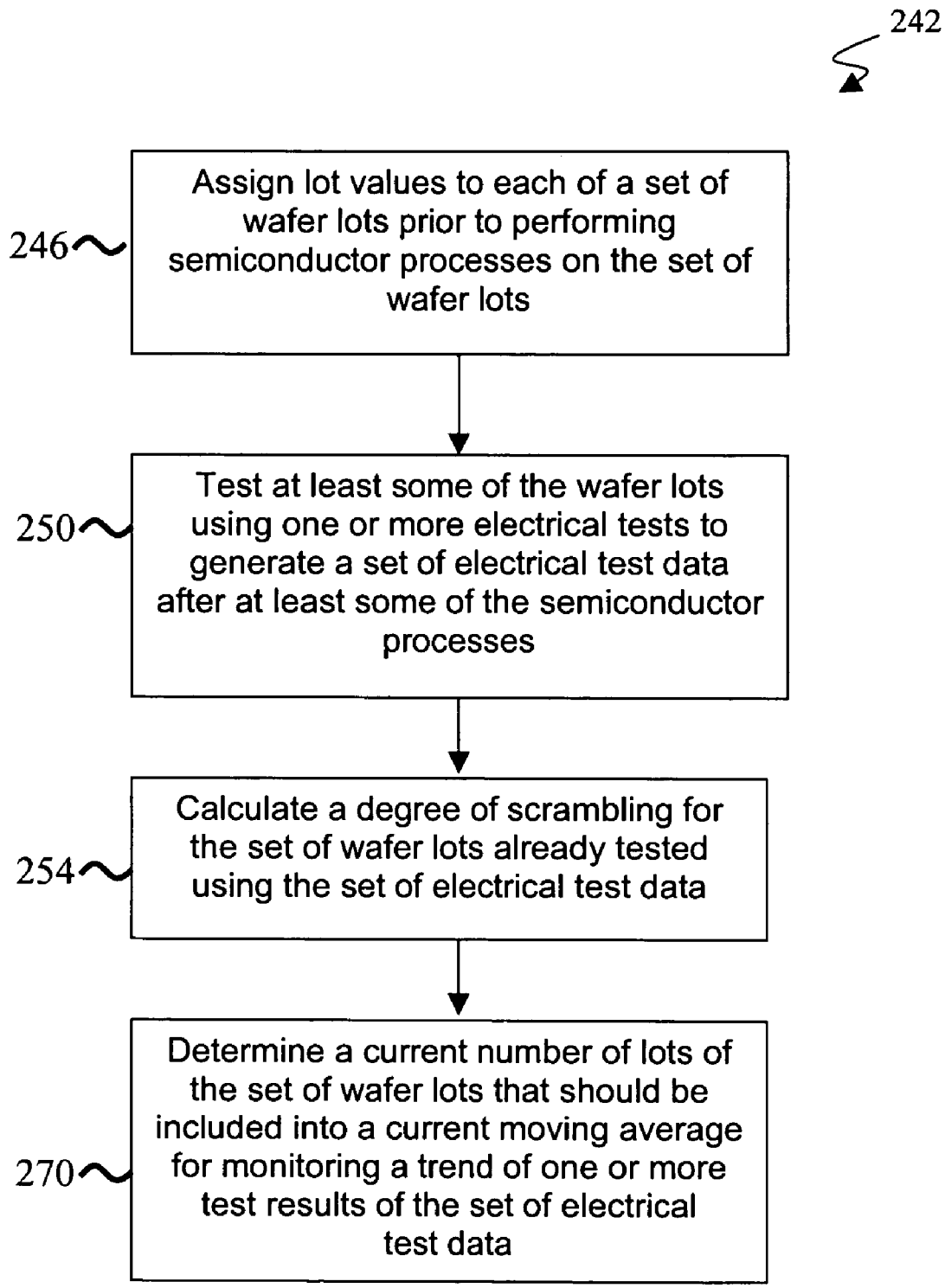
FIGS. 7 and 8 are flowcharts in accordance with a third illustrative embodiment of the present invention.
Figure 8:
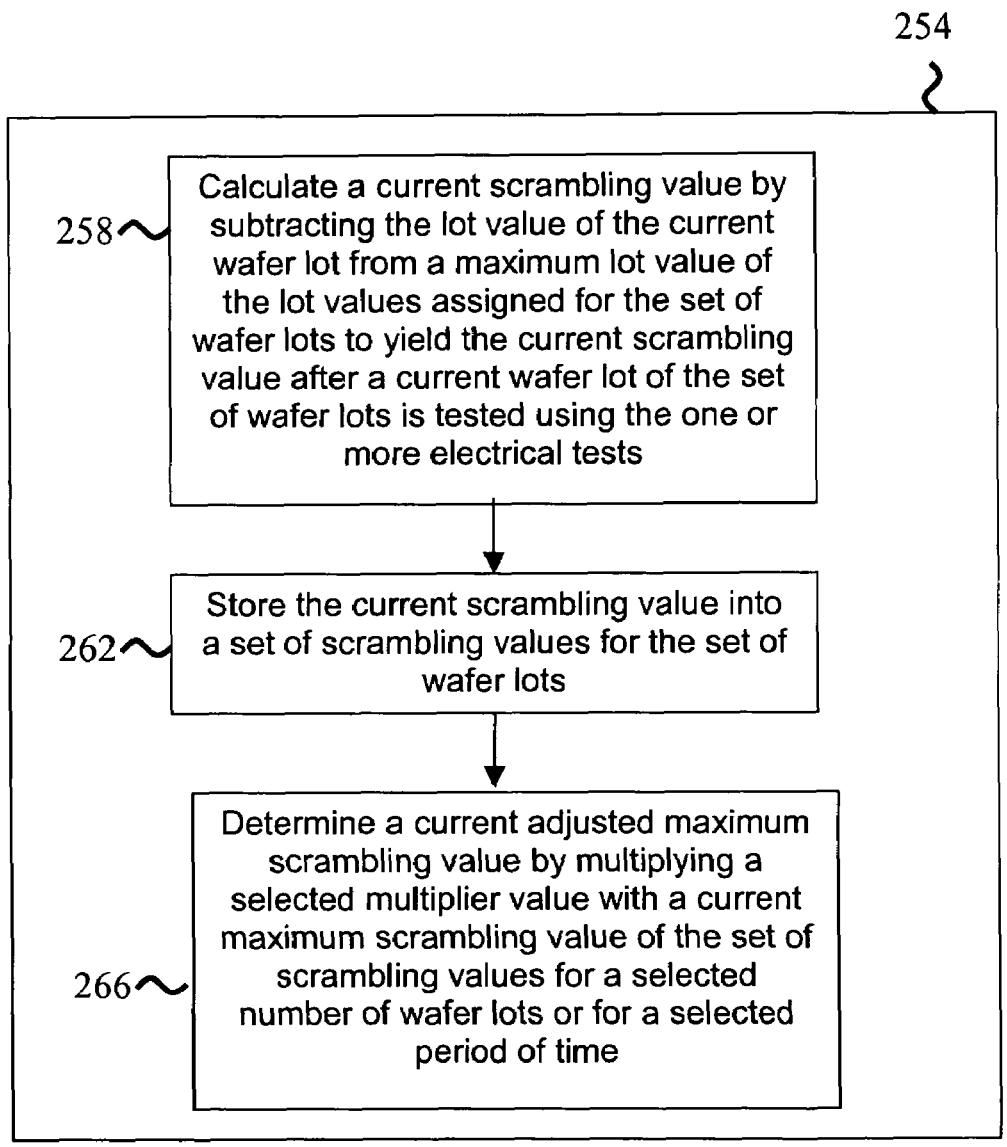

Referring now to the flowcharts in FIGS. 7 and 8, another method embodiment that more generally describes functions common in many of the embodiments of the present invention is shown. FIGS. 7 and 8 show a method of monitoring trends in semiconductor processes. FIG. 8 illustrates sub-steps of one of the steps in FIG. 7.

Referring now to the flowchart in FIG. 7, a fourth method embodiment of monitoring trends in semiconductor processes 242 is shown. Lot values are assigned to each of a set of wafer lots prior to performing semiconductor processes on the set of wafer lots (block 246). The lot values typically have an increasing sequential order corresponding to an order in which the set of wafer lots are started in a beginning of the semiconductor processes. At least some of the wafer lots are tested using one or more electrical tests to generate a set of electrical test data, after at least some of the semiconductor processes 250. A degree of scrambling for the set of wafer lots already tested is calculated 254. Calculating the degree of scrambling 254 includes the steps shown in FIG. 8, With reference to FIG. 8, a first step 258 in calculating the degree of scrambling (block 254) is shown. For the step 258, a current scrambling value is calculated by subtracting the lot value of the current wafer lot from a maximum lot value of the lot values assigned for the set of wafer lots to yield the current scrambling value after a current wafer lot of the set of wafer lots is tested using the one or more electrical tests. A second step 262 in calculating the degree of scrambling (block 254) includes storing the current scrambling value into a set of scrambling values for the set of wafer lots. A third step 266 in calculating the degree of scrambling (block 254) includes determining a current adjusted maximum scrambling value by multiplying a certain multiplier value with a current maximum scrambling value of the set of scrambling values for a certain period of time.

With reference again to FIG. 7, the step in block 270 is performed following the calculation of the degree of scrambling (block 254). For the step in block 270, a current number of lots of the set of wafer lots that should be included into a current moving average for monitoring a trend of one or more test results of the set of electrical test data is determined 270. Determining a current number of lots is performed by using the current adjusted maximum scrambling value as the current number of lots included into the current moving average. Thus, FIGS. 5-8 illustrate methods of implementing embodiments of the present invention.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of monitoring trends in semiconductor processes, the method comprising:

assigning lot values to each of a set of wafer lots prior to performing semiconductor processes on the set of wafer lots, wherein the lot values have an increasing sequential order corresponding to an order in which the set of wafer lots are started in a beginning of the semiconductor processes;

after at least some of the semiconductor processes, testing at least some of the wafer lots to generate a set of test data; and calculating a degree of scrambling for the set of wafer lots already tested, the calculating of the degree of scrambling comprising by subtracting a lot value from a largest lot value in the first data set;

after a current wafer lot of the set of wafer lots is tested, calculating a current scrambling value by subtracting the lot value of the current wafer lot from a maximum lot value of the lot values assigned for the set of wafer lots to yield the current scrambling value;

storing the current scrambling value into a set of scrambling values for the set of wafer lots, wherein the lot values include an average of a set of parameter values selected from the group consisting of moving average, and exponential weighted moving average; and determining a current adjusted maximum scrambling value by multiplying a selected multiplier value with a current maximum scrambling value of the set of scrambling values for a selected number of wafer lots.

2. The method of claim 1, further comprising:
determining a current number of lots of the set of wafer lots that should be included into a current moving average for monitoring a trend of one or more test results of the test data by using the current adjusted maximum scrambling value as the current number of lots included into the current moving average.

3. The method of claim 2, wherein the selected number of wafer lots is a number of wafer lots tested for a selected period of time prior to the testing of the current wafer lot.

4. The method of claim 1, wherein the testing uses one or more electrical tests.

5. The method of claim 1, further comprising:
comparing the current scrambling value to a threshold scrambling value; and
if the current scrambling value is less than the threshold scrambling value, classifying the current wafer lot as a high priority wafer lot.

6. The method of claim 5, further comprising performing a notifying action if the current wafer lot is classified as a high priority wafer lot.

7. The method of claim 5, wherein the threshold scrambling value is a moving average of the scrambling values.

8. The method of claim 5, wherein the method further comprises applying high priority evaluation and/or monitoring rules to the current wafer lot if the current wafer lot is classified as a high priority wafer lot.

9. The method of claim 1, wherein the assigning of the lot values comprises converting an original lot value to a number, wherein the original lot value comprises at least one alphabetic character and at least one numeric character.

10. A method of monitoring trends in semiconductor processes, the method comprising:
assigning lot values to each of a set of wafer lots prior to performing semiconductor processes on the set of wafer lots, wherein the lot values have an increasing sequential order corresponding to an order in which the set of wafer lots are started in a beginning of the semiconductor processes;
after at least some of the semiconductor processes, testing at least some of the wafer lots using one or more electrical tests to generate a set of electrical test data; and
calculating a degree of scrambling for determining a current number of lots of the set of wafer lots that should be included into a current moving average for monitoring a trend of one or more test results of the set of electrical test data by subtracting a lot value from a largest lot value in the first data set, wherein the average of the set of parameter values is selected from the group consisting of moving average, and exponential weighted moving average, the calculating of the degree of scrambling comprising:
after a current wafer lot of the set of wafer lots is tested using the one or more electrical tests, calculating a current scrambling value by subtracting the lot value of the current wafer lot from a maximum lot value of the lot values assigned for the set of wafer lots to yield the current scrambling value;
storing the current scrambling value into a set of scrambling values for the set of wafer lots; and
determining a current adjusted maximum scrambling value by multiplying a selected multiplier value with a current maximum scrambling value of the set of scrambling values for a selected number of wafer lots.

11. The method of claim 10, further comprising:
comparing the current scrambling value to a threshold scrambling value; and
if the current scrambling value is less than the threshold scrambling value, classifying the current wafer lot as a high priority wafer lot.

12. The method of claim 11, further comprising performing a notifying action if the current wafer lot is classified as a high priority wafer lot.

13. The method of claim 11, wherein the method further comprises applying high priority evaluation and/or monitoring rules to the current wafer lot if the current wafer lot is classified as a high priority wafer lot.

14. A method of monitoring integrated circuit manufacturing comprising:
manufacturing wafer lots, comprising:
assigning a first lot value to a first wafer lot, storing the first lot value in a first data set, assigning a second lot value to a second wafer lot, and storing the second lot value in the first data set, wherein the second lot value is greater than the first lot value by an incremental unit value, and wherein starting manufacturing of the second wafer lot occurs after starting manufacturing of the first wafer lot;
performing a wafer electrical test on the first wafer lot;
calculating a scrambling value for the first wafer lot by subtracting a lot value from a largest lot value in the first data set;
storing the scrambling value in a second data set, wherein the scrambling value is the first wafer lot value subtracted from a largest lot value in the first data set;
calculating a maximum scrambling value, wherein the maximum scrambling value is a currently largest scrambling value in the second data set scaled by a predetermined scaling factor;
obtaining a parameter value from the first wafer lot;
storing the parameter value in a third data set;
calculating a parameter moving average value, wherein the parameter moving average value is an average of a selected number of the parameter values from the third data set, wherein the average of the set of parameter values is selected from the group consisting of moving average, and exponential weighted moving average, the selected number of parameter values being the maximum scrambling value, and the selected number of the parameter values are from the wafer lots most recently tested;
storing the parameter moving average value in a fourth data set; and
applying a statistical process control rule to a set of parameter moving average values in the fourth data set.

15. The method of claim 14, wherein the method further comprises performing a notifying action if one or more values in the fourth data set is non-conforming to the statistical process control rule.

16. The method of claim 14, wherein the assigning the first lot value to the first wafer lot comprises converting an initial first lot value of the first wafer lot to a modified first lot value, wherein the initial first lot value includes characters selected from the group consisting of alphabetic character, numeric character, and combinations thereof.

17. The method of claim 14, wherein the predetermined scaling factor accounts for additional scrambling occurring during the manufacturing process.

18. The method of claim 14, wherein the predetermined parameter is selected from the group consisting of IDDQ, power, output voltage, output current, chip functionality, capacitance-voltage, and combinations thereof.

19. The method of claim 14, wherein the statistical process rule is selected from the group consisting of Western Electric rule, Shewhart rule, and combinations thereof.

20. The method of claim 1, further comprising:
calculating a maximum scrambling value, wherein the maximum scrambling value is a currently largest scrambling value in the second data set scaled by a predetermined scaling factor; and
selecting the predetermined parameter from the group consisting of IDDQ, power, output voltage, output current, chip functionality, capacitance-voltage, and combinations thereof.

* * * * *